United States Patent [19]

Ellis

[11] 4,366,434

[45] Dec. 28, 1982

[54] VOLTAGE DETECTORS AND ELECTRICAL CONTINUITY CHECKERS

[76] Inventor: Tony Ellis, 79, Fairleigh, Sheffield 2, England

[21] Appl. No.: 196,873

[22] Filed: Oct. 14, 1980

Related U.S. Application Data

[63] Continuation-in-part of Ser. No. 20,652, Mar. 15, 1979.

[30] Foreign Application Priority Data

Mar. 22, 1978 [GB] United Kingdom ............... 11444/78

[51] Int. Cl.³ ............................................. G01R 31/02
[52] U.S. Cl. .................................... 324/51; 324/72.5; 324/133; 324/149
[58] Field of Search ............... 324/51, 133, 72.5, 149, 324/53; 340/662; 307/359

[56] References Cited

U.S. PATENT DOCUMENTS

| | | | |
|---|---|---|---|
| 1,744,840 | 1/1930 | Strieby et al. | 324/133 X |
| 2,851,659 | 9/1958 | Ladrick | 324/51 X |
| 3,145,337 | 8/1964 | Lipson | 324/53 |
| 3,259,754 | 7/1966 | Matheson | 324/133 X |
| 3,628,059 | 12/1971 | Niu | 307/359 X |
| 4,011,508 | 3/1977 | Gabor | 324/51 X |
| 4,028,621 | 6/1977 | Bloxam | 324/51 |
| 4,207,517 | 6/1980 | Bloxam | 324/51 |
| 4,210,862 | 7/1980 | Koslar | 324/51 |

FOREIGN PATENT DOCUMENTS

| | | | |
|---|---|---|---|
| 180330 | 11/1954 | Austria | 324/149 |
| 2060884 | 6/1972 | Fed. Rep. of Germany | 324/133 |
| 601801 | 7/1978 | Switzerland | 324/53 |
| 587036 | 4/1947 | United Kingdom | 324/53 |
| 1467229 | 3/1977 | United Kingdom | 324/133 |

OTHER PUBLICATIONS

Maddison et al., Digital Logic Checker, Practical Electronics, Feb. 1977, p. 138.

Primary Examiner—Stanley T. Krawczewicz

[57] ABSTRACT

A combined voltage detector and electrical continuity checker in the form of a pencil having a needle capable of piercing electrical insulation, a pair of light emitting diodes for determining the polarity of the voltage, a third light emitting diode and associated circuitry to perform a continuity check, a flexible cable and chip which can be plugged into the pencil to perform either one of the tests in conjunction with the needle, and biasing arrangements for the light emitting diodes in order to lower their threshold of conduction.

10 Claims, 3 Drawing Figures

VOLTAGE DETECTORS AND ELECTRICAL CONTINUITY CHECKERS

This application is a continuation-in-part of Ser. No. 020,652, Mar. 15, 1979.

FIELD OF THE INVENTION

The present invention relates to voltage detectors, electrical continuity checkers and voltage polarity indicators.

There has been a great need for simple, cheap and robust combined voltage detector and continuity checker for the amateur electrical enthusiast or do it yourself person. There are many types of complicated electrical measuring instruments on the market which can, not only measure voltage, A.C. or D.C., current A.C. or D.C. and resistance, but also a number of other electrical parameters. These instruments whilst being precision instruments, are far too expensive for the average amateur electrical enthusiast or do it yourself person.

DESCRIPTION OF THE PRIOR ART

A large number of voltage detectors and continuity checkers are known. A selection of these known instruments are discussed hereunder.

British Pat. No. 587,036 (Chadwick) relates to a continuity checker and voltage "live" tester which is arranged in a "torch" casing. A bulb is provided at one end which can be illuminated by pressing the "clip" switch on the outside of the casing. A neon tube is provided for indicating the tests. Probes are used for the continuity check, the supply being obtained from an internal battery. Whilst the two probes are being used for the "live" voltage test, the circuit passes only through the neon lamp, so that the internal battery has no biasing function.

Austrian Pat. No. 180,330 (Reindl) is also a combined continuity check and voltage "live" tester. It is provided with a common "wander" spike and a "fixed" spike which is located either in a first socket for "live" voltage testing in which case a lamp indicates the result of the test, or in a second socket for continuity checking in which case the lamp indicates the result of the continuity check. The lamps are both filament bulbs. A push button switch 13 is provided to check the functioning of the filament lamp.

German Pat. No. 2,060,884 (Denecke) relates to a "pencil" type voltage tester and has a pair of liquid crystal display elements connected in parallel in opposite directions of conductivity. The liquid crystal display elements are connected in series with a resistor between a "fixed" end probe and a "wander" end probe. This type of voltage tester requires external control circuitry and its own separate power supply.

U.S. Pat. No. 2,851,659 (Ladrick) relates to electrical probes which can test both live and earthed conductors. If a conductor is "live", a red light lights, and if there is an adequate earth connection a green light lights.

U.S. Pat. No. 1,744,840 (Strieby) relates to an excess voltage tester. A potentiometer is connected across a power line and three neon tubes are connected across three tap points of this potentiometer. An approximate voltage across the power line can be determined according to whether one, two or three of the neons are lit.

U.S. Pat. No. 3,145,337 (Lipson) relates to a portable flashlight having provisions for making both continuity checks and voltage tests. The voltage tests which are available are restricted to the range 3 to 12 volts.

Finally, a digital logic checker is disclosed by P. D. Maddison in "Practical Electronics" February 1977 in the form of a very simple logic test clip and probe. The circuit includes a bridge circuit having a pair of light emitting diodes, each in series with a resistor in opposite arms of the bridge and a pair of diodes in the other two opposite arms.

One of the disadvantages inherent in the known types of combined voltage detectors and continuity checkers is that the display devices are vulnerable to excess voltages even those which employ light emitting diodes.

The potential required to operate a light emitting diode can be virtually as high as the designer decides, so that it can be made to suit a particular supply voltage. The range and the minimum voltages for proper conduction is considerable.

With regard to the minimum voltage for conduction, most commercially available light emitting diodes have a minimum voltage of 2 volts. This means that voltages below this value cannot readily be detected.

Furthermore, with some forms of detectors, it is desirable to have the displays on more than one face of the instrument, which means that the light emitting diodes must be connected in series to retain instrument sensitivity. If two or more such displays are provided the minimum voltage will increase by two or more times.

SUMMARY OF THE INVENTION

It is therefore an object of the present invention to provide a biasing arrangement for light emitting diodes used as a voltage detector and continuity checker in order to allow the minimum for threshold of conduction potential to be artificially lowered independently of the specific threshold potential of a particular light emitting diode array, so permitting the light emitting diodes to be used for detecting potentials lower than the actual conduction potential of an unbiased light emitting diode.

According to the present invention there is provided a combined voltage detector and electrical continuity checker comprising: a housing; first, second and third light emitting diodes provided on said housing; first, second and third terminals provided on said housing; at least one external lead for connection to a terminal; at least one D.C. bias source for said first and second light emitting diodes which are used primarily for voltage detection and polarity; a D.C. supply for said third light emitting diode which is used primarily for continuity checking; first circuit connection means for connecting said bias source and the first and second light emitting diodes in circuit between the first and second terminals; and second circuit connection means for connecting said D.C. supply and the third light emitting diode in circuit between the second and third terminals; and at least one D.C. bias source allowing the minimum voltage for conduction of the first and second light emitting diodes to be lowered.

BRIEF DESCRIPTION OF THE DRAWING

The present invention will now be described in greater detail by way of example with reference to the accompanying drawing, wherein.

DESCRIPTION OF THE PREFERRED EMBODIMENTS.

Figure 1:
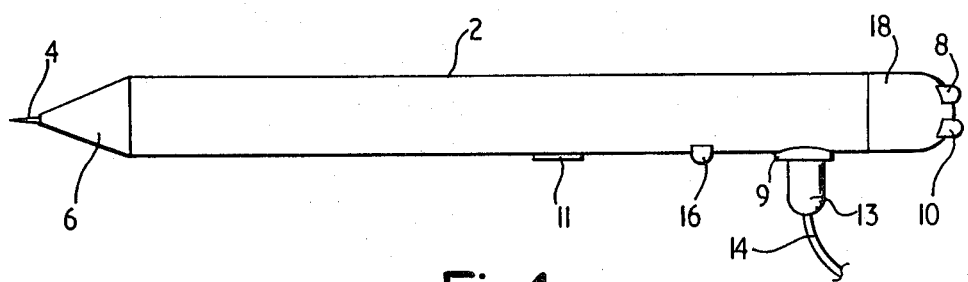
FIG. 1 is a diagrammatic view of the pencil type voltage detector and electrical continuity checker.

Referring first to FIG. 1, the voltage detector and continuity checker is in the form of a pencil having a hollow case 2 partly filled with epoxy resin. A steel insulation piercing needle 4 is provided at the pointed end 6 of the pencil and a screw-threaded or bayonet type cap 18 is provided at the other end. A pair of light emitting diodes 8 and 10 are provided in the cap 18. A pair of sockets 9 and 11 are provided, in the side of the casing 2. A third light emitting diode 16 is provided on the side of the casing 2 between the two sockets 9 and 11. A non-snag clip 12 in the form of a crocodile clip is connected to the upper part of the pencil case 2 by means of a flexible insulated cable 14 and plug 13. The plug 13 is adapted to be a push fit into either the socket 9 for use as a voltage detector or into the socket 11 for use as a continuity checker.

The cap 18 of the casing 2 remote from the needle 4 which contains the diodes 8 and 10 is detachable to enable the insertion of three slim-line pencil batteries (not shown) to be inserted into three separate compartments within the casing 2.

A second flexible insulated cable (not shown) together with an associated non-snag clip at one end and a plug at the other end is provided for connection to the socket 11 in the case where it is desired to carry out a continuity check.

In use, the voltage detector and electrical continuity checker is designed to pierce the insulation of any electrical conductor with the aid of the needle 4 and the clip 12 is clipped to any conductor or part of the circuit connected to earth or zero potential.

The pencil type voltage detector and electrical continuity tester is designed particularly for automobile use although it is capable of detecting any voltage whether A.C. or D.C. The polarity of the D.C. voltage is determined according to which light emitting diode lights. Preferably the two light emitting diodes 8 and 10 are of different colors i.e. red and green to give a clear indication as to whether the voltage is positive or negative according to which colored light emitting diode is lit. The third light emitting diode 16 which is used for the continuity check is preferably yellow so that it can be readily distinguished from the other two diodes.

Figure 2:
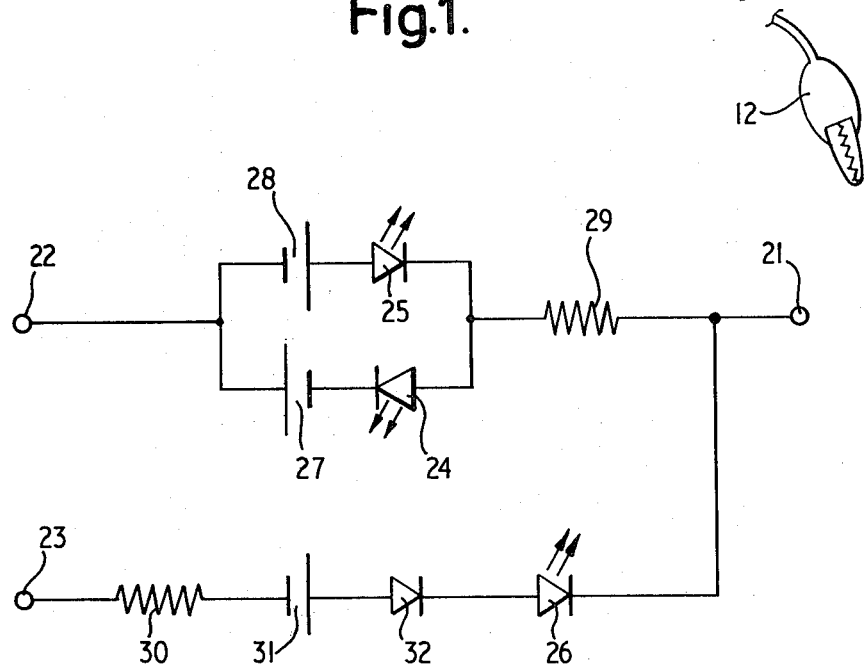
FIG. 2 is a circuit diagram of the voltage detector and electrical continuity checker shown in FIG. 1.

Referring now to the circuit diagram of the voltage detector and electrical continuity checker shown in FIG. 2, the circuit includes three light emitting diodes 25, 24 and 26 which are equivalent to the respective light emitting diodes 8, 10 and 16 respectively shown in FIG. 1. Terminals 21, 22 and 23 are connected to the socket 9, the needle 4 and the socket 11 respectively. In series with each light emitting diode 24 and 25 are respective 1.5 volt dry batteries 27 and 28, these batteries acting as bias batteries and connected in the same sense of conduction as the respective light emitting diodes.

The light emitting diodes 24 and 25 together with the associated series batteries 27 and 28 form an inverse parallel circuit, the positive terminal of the battery 27 and the negative terminal of the battery 28 being connected to the terminal 22 whilst the anode of the light emitting diode 24 and the cathode of the light emitting diode 25 are connected to the terminal 21 through a 33 Kohm resistor 29.

The cathode of the light emitting diode 26 is also connected to the terminal 21. Between the terminal 23 and the anode of the light emitting diode 26 there is connected a series circuit consisting of a 22 Kohm resistor 30, a 12 volt dry battery 31 and a rectifying diode 32.

The above described circuit is designed to operate as a voltage detector, continuity checker and polarity indicator as follows:

(a) Between the terminals 21 and 22, the circuit will detect between 0.5 volts and 260 volts D.C. and also indicate polarity and between 1.0 volt A.C. (RMS) and 260 volts A.C. (RMS) according to which of the light emitting diodes 24 and 25 are lit.

(b) Between the terminals 22 and 23, the circuit will detect up to 440 volts D.C. and 880 volts A.C. (RMS) which is indicated by the light emitting diode 26. It will also operate as a continuity checker passing approximately 100 microamps on short circuit between the terminals 22 and 23.

(c) Between the terminals 21 and 23 the circuit will check continuity from zero up to approximately 500 Kohms, and passing approximately 400 microamps D.C. on short circuit, this being indicated by the light emitting diode 26.

It will be noted that the combined voltage detector and continuity checker will stand up to full mains voltage across any pair of terminals. Furthermore, it can also withstand a transient overload voltage up to 800 volts D.C. or A.C. (RMS) between the terminals 21 and 22 and up to 600 volts D.C. or 1000 volts A.C. (RMS) between the terminals 21 and 23.

The bias batteries 27 and 28 can be the smallest 1.5 volts slim-line pencil cells since the circulating current will be less than 4 microamps. Alternatively photovoltaic cells could be used instead of the dry battery cells. The photovoltaic cells could be incorporated in a multi-segment light emitting diode display unit and will use ambient light to supply bias EMF. Furthermore, radiant light for the display could be arranged to irradiate the photovoltaic cells and provide an amplified effect on the bias voltage.

Figure 3:
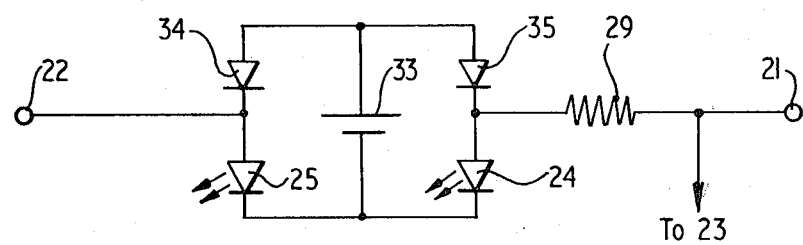
FIG. 3 is part of a circuit diagram showing an alternative form of biasing circuit for the combined voltage detector and continuity checker.

Referring now to FIG. 3, the modified circuit includes between the terminal 23 and the resistor 29, a bridge circuit comprising the light emitting diodes 24 and 25 each in one pair of arms, and diodes 34 and 35 each in the other pair of arms. The junction between the diode 34 and the light emitting diode 25 is connected to the terminal 23, whilst the junction between the diode 35 and the light emitting diode 24 is connected to the resistor 29. A 1.5 volt dry cell of the slim-line pencil type or button type is connected across the other diagonal of the bridge and acts as a bias for both light emitting diodes 24 and 25. The rest of the circuit is otherwise identical with that shown in FIG. 2 and so is its operation.

In an alternative form, the light emitting diodes can be replaced with a digital light emitting diode display.

The lowest input voltage detectable would be approximately 0.5 volts D.C. and the safest pierced input voltage is determined by the value of resistance of resistor 30 and also the peak inverse voltage of rectifier diode 32.

Figure 4:
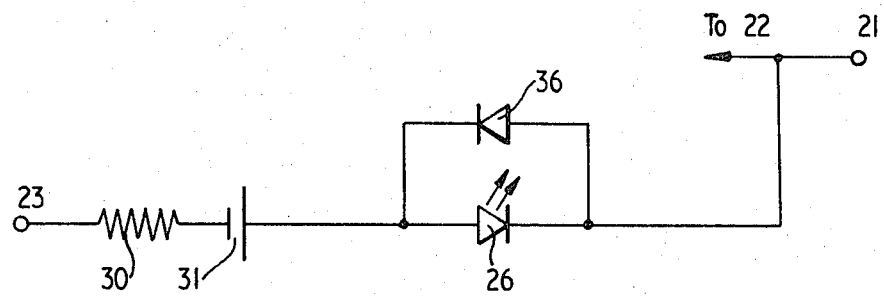
FIG. 4 is part of a circuit diagram showing an alternative arrangement of the circuit shown in FIG. 2.

In the alternative circuit arrangement shown in FIG. 4, the circuit between the terminals 21 and 23 is modified by removing the diode 32, and inserting a diode 36 which is connected in parallel with the light emitting diode 26 in the opposite sense of conductivity. This not only has the advantage of further increasing the range of voltage detection between the terminals 22 and 23, but if a rechargeable battery is used as the battery 31, the battery can be recharged by passing D.C. or rectified A.C. between the terminals 21 and 23.

Figure 5:
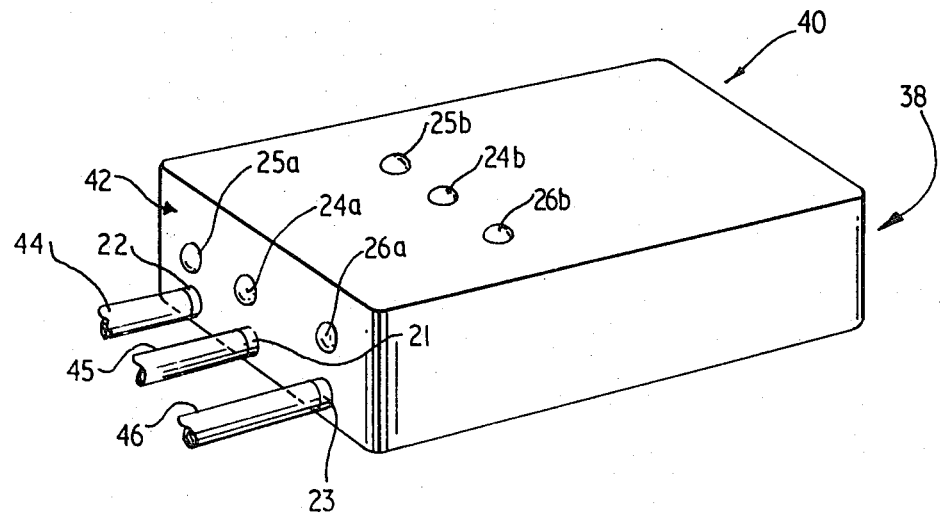
FIG. 5 is a perspective view of a second embodiment of the combined voltage detector and electrical continuity checker in which the circuits are housed in a rectangular box.

For some applications it may be more convenient to house the circuits within a more conventional casing in the form of a rectangular box. A second embodiment of the casing is shown in FIG. 5. In this embodiment the casing comprises a rectangular box 38 having a lid 40. On one of the short sides 42 of the box 38, the three terminals 22, 21 and 23 are arranged in a row towards the lower edge. Plug in leads 44, 45 and 46 are associated with the respective terminals 22, 21 and 23, the remote ends of which may be provided with either probes or crocodile clips. Immediately above the terminals 22, 21 and 23 are provided three light emitting diodes 25a, 24a and 26a. A second set of light emitting diodes 25b, 24b and 26b are located on the lid 40. The diodes 25a and 25b are connected in series and replace the single diode 25 in the circuits shown. Likewise the pairs of diodes 24a, 24b and 26a, 26b are connected in series and replace the diodes 24 and 26 in the circuits shown in FIG. 2 or FIG. 3.

A gasket (not shown) is preferably provided between the lid 40 and the box 38, so that when the lid is screwed down the casing is completely watertight.

The circuits disclosed in the above described embodiments are not only simple and cheap to manufacture, but are very robust and the light emitting diodes are able to detect very low voltages by virtue of their biasing arrangements.

The second embodiment has the further advantage that the box may be made waterproof, and the display may be on two or more sides or faces of the box.

I claim:

1. A combined voltage detector and electrical continuity checker comprising: a housing; first, second and third light emitting diodes provided on said housing; first, second and third terminals provided on said housing; at least one external lead for connection to a terminal; at least one D.C. bias source for said first and second light emitting diodes which are used primarily for voltage detection and polarity; a D.C. supply for said third light emitting diode which is used primarily for continuity checking; first circuit connection means for connecting said bias source and the first and second light emitting diodes in circuit between the first and second terminals; and second circuit connection means for connecting said D.C. supply and the third light emitting diode in circuit between the second and third terminals; said at least one D.C. bias source allowing the minimum voltage for conduction of the first and second light emitting diodes to be lowered.

2. A combined voltage detector and electrical continuity checker according to claim 1, wherein there are two D.C. bias sources connected in series with the first and second light emitting diodes respectively, the two series circuits being connected in anti-parallel relationship with respect to one another between said first and second terminals.

3. A combined voltage detector and electrical continuity checker according to claim 2, wherein a resistor and a third diode are connected in series with said D.C. supply and third light emitting diode between the first and third terminals.

4. A combined voltage detector and electrical continuity checker according to claim 1, wherein the first and second diodes are connected in series with the first and second light emitting diodes respectively, said first and second light emitting diodes and the first and second diodes being connected to form a bridge circuit, the D.C. bias supply being connected across the junction between the two diodes and the junction between the two light emitting diodes, the junction between said first light emitting diode and first diode being connected to the first terminal, and the junction between the second light emitting diode and second diode being connected to the second terminal.

5. A combined voltage detector and electrical continuity checker according to Claim 4, wherein a resistor and a third diode are connected in series with the third light emitting diode, and the D.C. supply between the first and third terminals.

6. A combined voltage detector and electrical continuity checker according to Claim 4, wherein a third diode is connected in anti-parallel relationship with the third light emitting diode and a resistor is connected in series with the D.C. supply and parallel circuit between the first and third terminals.

7. A combined voltage detector and electrical continuity checker according to Claim 1, wherein said casing is in the form of a pencil having a hollow case provided with a probe at one end forming said second terminal, said first and third terminals being housed on the side of the pencil together with the third light emitting diode, a cap being provided on the other end of the pencil and housing the second and third light emitting diodes.

8. A combined voltage detector and electrical continuity checker according to claim 1, wherein said casing is in the form of a box having a lid sealing therewith in watertight manner, said three terminals and three light emitting diodes being located on one side face of the box.

9. A combined voltage detector and electrical continuity checker according to claim 8, wherein at least one further face of the box and lid is provided with a duplicated array of light emitting diodes each connected in series with the respective first, second and third light emitting diodes.

10. A combined voltage detector and electrical continuity checker according to claim 1, wherein said light emitting diodes emit light of different colors for easy identification.

* * * * *